United States Patent [19]

Wakayama

[11] Patent Number: 5,140,195

[45] Date of Patent: Aug. 18, 1992

[54] LEVEL CONVERTING CIRCUIT WITH A BYPASS TRANSISTOR

[75] Inventor: Yasushi Wakayama, Tokyo, Japan

[73] Assignee: NEC Corporation, Tokyo, Japan

[21] Appl. No.: 610,899

[22] Filed: Nov. 9, 1990

[30] Foreign Application Priority Data

Nov. 9, 1989 [JP] Japan .................. 1-291466

[51] Int. Cl.$^5$ ........................................... H03K 19/094
[52] U.S. Cl. .................................. 307/475; 307/443; 307/451
[58] Field of Search ............... 307/475, 264, 451, 452, 307/443, 542, 544, 558, 448

[56] References Cited

U.S. PATENT DOCUMENTS

| | | | |
|---|---|---|---|
| 4,380,710 | 4/1983 | Cohen et al. .................. | 307/475 |
| 4,704,547 | 11/1987 | Kirsch .......................... | 307/443 |
| 4,707,623 | 11/1987 | Bismarck ...................... | 307/475 |
| 4,782,250 | 11/1988 | Adams et al. ................. | 307/475 X |
| 4,937,477 | 6/1990 | Tsoi et al. ..................... | 307/475 |
| 4,945,264 | 7/1990 | Lee et al. ...................... | 307/475 |
| 4,963,771 | 10/1990 | Chang .......................... | 307/542 X |
| 4,996,443 | 2/1991 | Tateno .......................... | 307/475 X |
| 4,999,529 | 3/1991 | Morgan Jr. et al. ........... | 307/475 |

*Primary Examiner*—David Hudspeth
*Attorney, Agent, or Firm*—Sughrue, Mion, Zinn, Macpeak & Seas

[57] ABSTRACT

A high speed electrical level converting circuit which converts an input signal into an output signal having a different potential from that of the input signal. A falling edge detector detects the falling edge of the input signal when the input signal changes from a high potential to a low potential. A short circuiting device serves to drain charge accumulated at the output terminal for a predetermined duration in response to a signal from the falling edge detector so as to allow the level converting circuit to make a transition from a high output to a low output in a very fast manner.

6 Claims, 2 Drawing Sheets

LEVEL CONVERTING CIRCUIT WITH A BYPASS TRANSISTOR

BACKGROUND OF THE INVENTION

The present invention relates to a level converting circuit for use in semiconductor integrated circuits or the like, and more particularly to a level converting circuit for reducing the amplitude, such as converting the CMOS level used in CMOS devices to the level used in ECL devices.

According to the prior art, as will be stated in detail afterwards, the conventional level converting circuit, composed of an MOS transistor, converts the high level of input signals into the positive source voltage of the level converting circuit and the low level, into a voltage resulting from the division of the positive source voltage by the sourcedrain impedance of the transistor. Such a level converting circuit, however, operates at a relatively low speed. Though the problem of the low speed in the circuit can be resolved by the increase in the current of the circuit, there arises another problem of consuming more power.

SUMMARY OF THE INVENTION

An object of the present invention, therefore, is to provide a level converting circuit capable of high speed operation with relatively less power consumption.

A level converting circuit of the invention converts an input signal having a predetermined potential into an output signal having a different potential. The level converting circuit includes a first power supply circuit for supplying a predetermined first potential. A second power supply circuit supplies a predetermined second potential which is lower than the first potential. A first inverter receives the input signal and outputs it as an inverted input signal. A first P type transistor, whose source electrode is connected to first power supply circuit, receives the inverted input signal at its gate electrode. A second P type transistor, of which the drain electrode and the gate electrode are connected to each other, the source electrode is connected to the first power supply circuit and the drain electrode is connected to the drain electrode of the first P type transistor, outputs the voltage of its gate electrode as the output signal. A first N type transistor, whose drain electrode is connected to the drain electrode of the first P type transistor, receives the inverted input signal at its gate electrode. A second N type transistor is provided, of which the gate electrode receives a reference potential having a predetermined level, the drain electrode is connected to the source electrode of the first N type transistor, and the source electrode is connected to the second power supply circuit. A falling edge detector detects the falling edge of the inverted input signal and generates a detection signal. A short-circuit is responsive to the detection signal for short-circuiting the source electrode and the drain electrode of the second N type transistor for a prescribed duration.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Figure 1:
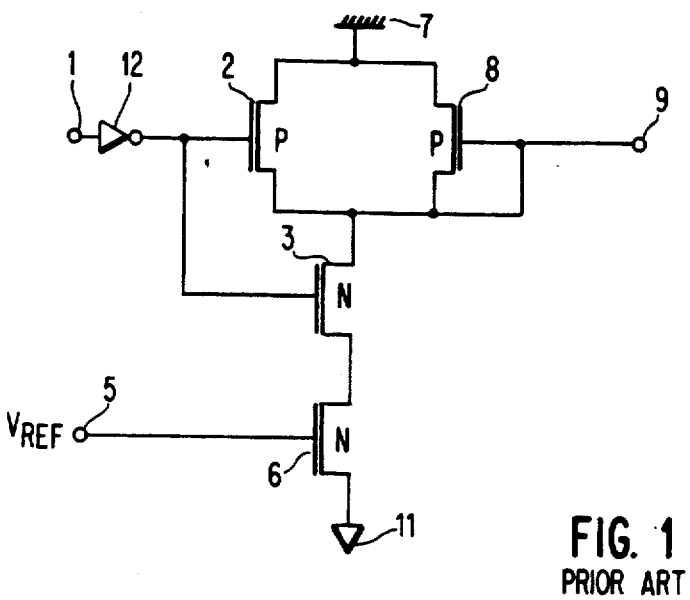
FIG. 1 is a circuit diagram illustrating a level converting circuit according to the prior art.

To facilitate understanding of the present invention, the configuration and operation of a level converting circuit according to the prior art will be described first. FIG. 1 is a circuit diagram illustrating a level converting circuit according to the prior art. As shown in FIG. 1, a signal input terminal 1 is connected to the gate electrode (gate) of a first P channel type MOS transistor (P type transistor) 2 and that of a first N channel type MOS transistor (N type transistor) 3, and a reference voltage input terminal 5 is connected to the gate of a second N type transistor 6. A positive power source 7 is connected to the source electrode (source) of the first P type transistor 2 and that of a second P type transistor 8. Meanwhile, the drain electrode (drain) of the first P type transistor 2 is connected to the drain and gate of the second P type transistor 8, a signal output terminal 9 and the drain of the first N type transistor 3. Further, the source of the first N type transistor 3 is connected to the drain of the second N type transistor 6, whose source is connected to a negative power source 11.

In such a level converting circuit, the drain and gate of the second P type transistor 8 are connected to each other, and this transistor can be regarded as a resistor. The second N type transistor 6 can be deemed to be a constant current source because of a reference voltage fed to its gate. Now it is supposed that the input signal has a high level of 0 V and a low level of $-5.2$ V, the voltages of the positive power source 7 and the negative power source 11 are 0 V and $-5.2$ V, respectively, and the reference voltage $V_{REF}$ is $-3$ V. The input signal supplied to the input terminal 1, after being inverted by an inverter circuit 12, is fed to the gates of the first P type and N type transistors 1 and 3. Since the output of the inverter 12 is at its low level when the input signal is at its high level, the first P type transistor 2 is turned ON and the first N type transistor 3, OFF when the input signal is at a high level. As a result, 0 V which is the voltage of the positive power source 7 is supplied from the output terminal 9. On the other hand, when the input signal is at its low level, the first P type transistor 1 is turned OFF and the first N type transistor 3, ON. As a result, there is obtained at the output terminal 9 a value resulting from the division of the potential difference between the positive voltage source 7 and the negative voltage source 11 by the source-drain impedance (channel impedance) of the second P type transistor 8 and that of the series circuit of the first and second N type transistors 3 and 6. As the channel impedance is variable with the channel width, the level converting circuit is so designed as to give any desired output voltage.

If it is attempted to increase the operating speed of the level converting circuit illustrated in FIG. 1, when the output voltage changes from the low level to the high level, the length of time required for the change (rising time) can be shortened by increasing the driving capacity of the first P type transistor 2. When the output voltage changes from the high level to the low level, the falling time can be shortened by increasing the current flowing into the constant current source consisting of the reference voltage and the second N type transistor 6. However, the reduction of the falling time requires a greater constant current and accordingly involves the consumption of more power.

Figure 2:
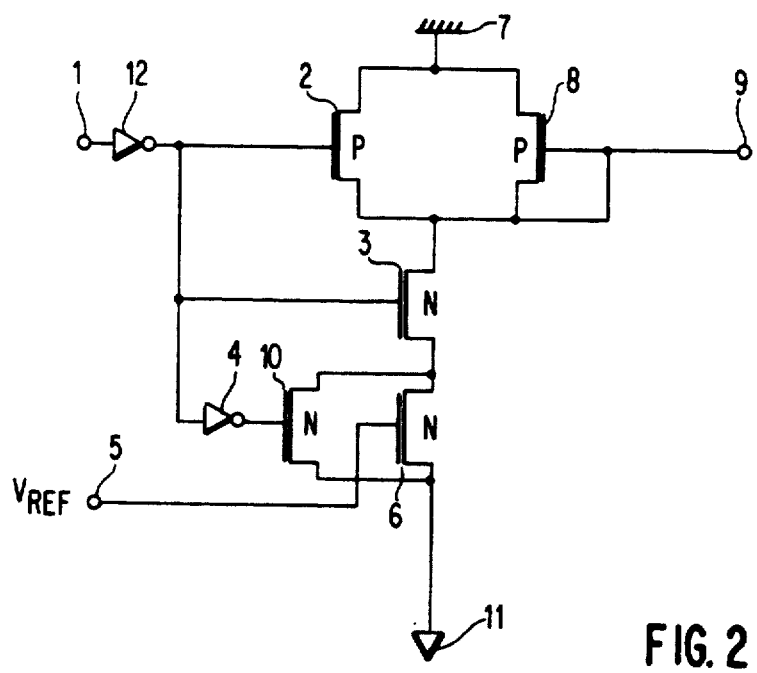
FIG. 2 is a circuit diagram illustrating a level converting circuit according to a first preferred embodiment of the invention.

FIG. 2 is a circuit diagram illustrating a level converting circuit according to the present invention. In FIG. 2, the same constituent elements as in FIG. 1 are assigned respectively the same reference numerals. In this preferred embodiment of the invention, the configuration of FIG. 1 is augmented with a third N type transistor 10 connected in parallel with the second N type transistor 6, and a second inverter 4 for inverting the output of the first inverter 12 and supplying the inverted output to the gate of the third N type transistor 10.

Next, the operation of the first embodiment of the invention will be described. The operation which takes place when the input signal rises from the low level to the high level is the same as in the prior art circuit of FIG. 1. Thus, as the input signal is at its high level, the first inverter 12 provides a low level output, and the first P type transistor 2 is turned ON. The third N type transistor 10, whose gate is supplied with the high level by the second inverter 4, is also turned ON, but both the first N type and the second P type transistors 3 and 8 are OFF, so that the voltage of the positive voltage source 7 is supplied from the output terminal 9. Meanwhile, when the input signal falls from the high level to the low level, the output of the first inverter 12 rises from the low level to the high level, the first P type transistor 2 is turned OFF and the first N type transistor 3, ON. At this time, the output of the second inverter 4 changes from the low level to the high level with a delay by its gate delay time, and turns the third N type transistor 10 from ON to OFF. Thus, the third N type transistor 10 is kept ON during the gate delay time of the second inverter 4 after the fall of the input signal. When the input signal falls, the charge accumulated at the output terminal 9 flows at high speed into the negative power source 11 via the first N type transistor 3 and the third N type transistor 10, which have been turned ON. As in the prior art circuit shown in FIG. 1, a voltage resulting from the division of the negative voltage of the power source 11 by the source-drain impedance of the first and second N type transistor 3 and 6 is supplied from the output terminal 9. Thus, in the level converting circuit according to the present invention, the third N type transistor 10 is provided for bypassing the second N type transistor 6 as the constant source and, by giving it continuity for a certain length of time when the input signal falls, the fall of the output voltage can be accelerated without consuming extra power.

Figure 3:
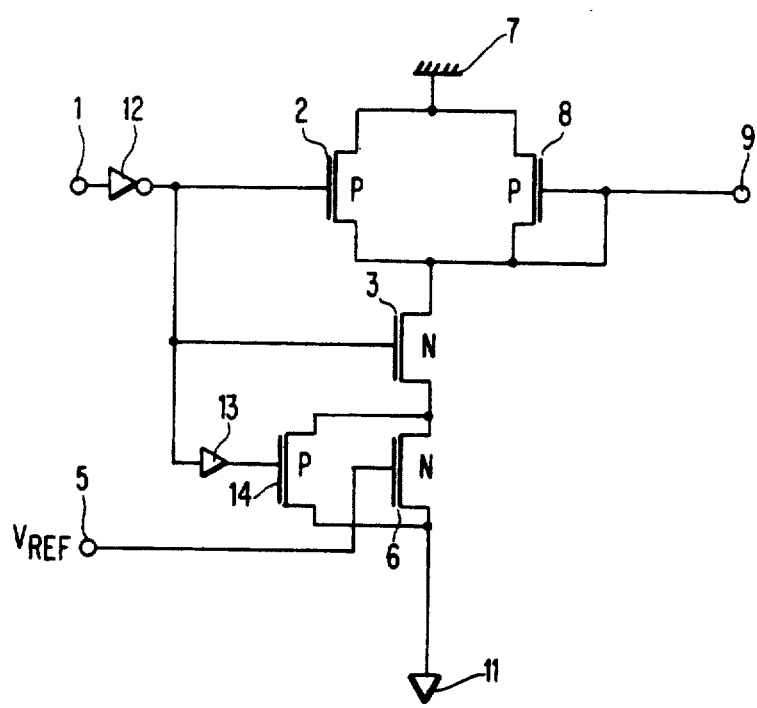
FIG. 3 is a circuit diagram according to a second preferred embodiment of the invention.

FIG. 3 is a circuit diagram illustrating another preferred embodiment of the invention. This level converting circuit has a configuration in which the second inverter 4 and the third N type transistor 10 in FIG. 2 are replaced with a transfer gate 13 and a third P type transistor 14, respectively. Thus in this alternative embodiment, the same benefit as that of the embodiment shown in FIG. 2 is achieved by keeping the third P type transistor 14 ON by the delay time of the transfer gate 13 after the rising of the output of the first inverter 12.

What is claimed is:

1. A level converting circuit for converting an input signal having a predetermined potential into an output signal having a different potential and supplying the output signal, comprising:

first power supply means for supplying a predetermined first potential;

second power supply means for supplying a predetermined second potential lower than said first potential;

first inverter means for receiving said input signal and outputting it as an inverted input signal;

a first P type transistor, whose source electrode is connected to first power supply means, for receiving said inverted input signal at its gate electrode;

a second P type transistor, of which the drain electrode and the gate electrode are connected to each other, the source electrode is connected to said first power supply means and the drain electrode is connected to the drain electrode of said first P type transistor, for outputting the voltage of its gate electrode as said output signal;

a first N type transistor, whose drain electrode is connected to the drain electrode of said first P type transistor, for receiving said inverted input signal at its gate electrode;

a second N type transistor, of which the gate electrode receives a reference potential having a predetermined level, the drain electrode is connected to the source electrode of said first N type transistor, and the source electrode is connected to said second power supply means, for operating as a constant current source;

falling edge detecting means for detecting the fall of said inverted input signal and generating a detection signal; and short-circuiting means responsive to said detection signal for short-circuiting the source electrode and the drain electrode of said second N type transistor for a prescribed duration.

2. A level converting circuit, as claimed in claim 1, wherein said falling edge detecting means is shorter means.

3. A level converting circuit, as claimed in claim 2, wherein said short-circuiting means is a third N type transistor of which the gate electrode receives said detection signal, the source electrode is connected to said second power supply means, and the drain electrode is connected to the source electrode of said first N type transistor.

4. A level converting circuit, as claimed in claim 1, wherein said falling edge detecting means is delay means.

5. A level converting circuit, as claimed in claim 4, wherein said short-circuiting means is a third P type transistor of which the gate electrode receives said detection signal, the source electrode is connected to said second power supply means, and the drain electrode is connected to the source electrode of said first N type transistor.

6. A level converting circuit for converting an input signal having a predetermined potential into an output signal having a different potential and supplying the output signal, comprising:

first power supply means for supplying a predetermined first potential;

second power supply means for supplying a predetermined second potential lower than said first potential;

switching circuit means whose one end is connected to said first power supply means, comprising first and second switching means connected in series, and being operatively coupled so that one is turned OFF when the other is ON in response to said input signal;

constant current means of which one end is connected to the other end of said switching circuit means and the other is connected to said second power supply means, for supplying constant current to the level converting circuit;

load means, of which one end is connected to said first power supply means and the other to the connection point of said first and second switching means, for supplying said predetermined potential at the second end as said output signal;

transition point detecting means, responsive to said input signal, for detecting the predetermined one of leading and trailing edges of said input signal and generating an edge detection signal; and short-circuiting means connected to said transition point detecting means so as to be responsive to said edge detection signal for short-circuiting the two ends of said constant current means.

* * * * *

UNITED STATES PATENT AND TRADEMARK OFFICE
CERTIFICATE OF CORRECTION

PATENT NO. : 5,140,195
DATED : August 18, 1992
INVENTOR(S) : Yasushi Wakayama

It is certified that error appears in the above-indentified patent and that said Letters Patent is hereby corrected as shown below:

Col. 1, line 19, delete "sourcedrain" and insert --source-drain--;

Col. 3, line 50, after "constant" and insert --current--;

Col. 4, line 37, delete "shorter" and insert --inverter--.

Signed and Sealed this

Seventh Day of September, 1993

Attest:

BRUCE LEHMAN

*Attesting Officer*   *Commissioner of Patents and Trademarks*